United States Patent
Fenney et al.

(10) Patent No.: US 10,972,126 B2
(45) Date of Patent: Apr. 6, 2021

(54) DATA COMPRESSION AND STORAGE

(71) Applicant: Imagination Technologies Limited, Kings Langley (GB)

(72) Inventors: Simon Fenney, Hertfordshire (GB); Greg Clark, Hertfordshire (GB); Alan Vines, Hertfordshire (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 16/698,687

(22) Filed: Nov. 27, 2019

(65) Prior Publication Data
US 2020/0177200 A1 Jun. 4, 2020

(30) Foreign Application Priority Data
Nov. 30, 2018 (GB) .................................... 1819541

(51) Int. Cl.
*H03M 7/40* (2006.01)
*G06N 3/04* (2006.01)
*G06N 3/08* (2006.01)

(52) U.S. Cl.
CPC ............. *H03M 7/40* (2013.01); *G06N 3/04* (2013.01); *G06N 3/08* (2013.01)

(58) Field of Classification Search
CPC ........ H03M 7/40; H03M 7/42; H03M 7/4006; H03M 7/425; H03M 7/4037; H03M 7/46;
(Continued)

(56) References Cited

U.S. PATENT DOCUMENTS

| | | | | |
|---|---|---|---|---|
| 5,712,863 A | * | 1/1998 | Gray | ................. G11B 20/10 370/506 |
| 10,049,427 B1 | | 8/2018 | Lachowsky | |

(Continued)

FOREIGN PATENT DOCUMENTS

| | | |
|---|---|---|
| GB | 2520930 A | 6/2015 |
| GB | 2562897 A | 11/2018 |

(Continued)

OTHER PUBLICATIONS

Anonymous: "Interleaving (data)", Wikipedia, Oct. 3, 2010; Retrieved from the Internet: URL:https://en.wikipedia.org/w/index.php?title=Interleaving_(data)&oldid=862321868[retrieved on Mar. 26, 2020]; 1 page.

(Continued)

*Primary Examiner* — Linh V Nguyen
(74) *Attorney, Agent, or Firm* — Potomac Law Group, PLLC; Vincent M DeLuca

(57) ABSTRACT

A data compression method comprises encoding groups of data items by generating, for each group, header data comprising h-bits and a plurality of body portions each comprising b-bits and each body portion corresponding to a data item in the group. The value of h may be fixed for all groups and the value of b is fixed within a group, wherein the header data for a group comprises an indication of b for the body portions of that group. In various examples, b=0 and so there are no body portions. In examples where b is not equal to zero, a body data field is generated for each group by interleaving bits from the body portions corresponding to data items in the group. The resultant encoded data block, comprising the header data and, where present, the body data field can be written to memory.

20 Claims, 10 Drawing Sheets

FIG. 2

(58) Field of Classification Search
CPC ...... H03M 7/607; H03M 7/00; H03M 7/3086; H03M 7/3093; H03M 7/55; H03M 7/6029; H03M 7/6035; H03M 13/39; H03M 13/41; H03M 13/6312
USPC .............................................. 341/60, 65–67
See application file for complete search history.

(56) References Cited

U.S. PATENT DOCUMENTS

| | | | | |
|---|---|---|---|---|
| 2002/0114397 A1* | 8/2002 | Todo | ........................ | H03M 7/40 375/240.29 |
| 2004/0064782 A1* | 4/2004 | Lerner | ................... | H04B 3/542 714/800 |
| 2004/0123221 A1* | 6/2004 | Huffman | ............. | H03M 13/093 714/776 |
| 2007/0047657 A1* | 3/2007 | Toma | ................. | H04N 21/2383 375/240.24 |
| 2011/0069708 A1* | 3/2011 | Song | ................. | H04L 25/03171 370/392 |
| 2013/0086442 A1* | 4/2013 | Baptist | ................ | G06F 11/1076 714/752 |
| 2016/0277145 A1* | 9/2016 | Grant | ........................ | H04L 1/00 |
| 2017/0053376 A1 | 2/2017 | Bolz et al. | | |
| 2018/0082181 A1 | 3/2018 | Brothers et al. | | |
| 2019/0250860 A1* | 8/2019 | Tian | .......................... | G06F 3/08 |

FOREIGN PATENT DOCUMENTS

| | | |
|---|---|---|
| GB | 2567429 A | 4/2019 |
| WO | 2014116712 A1 | 7/2014 |

OTHER PUBLICATIONS

Anonymous: algorithm—Interleaving/multiplexing compressed streams; Stack Overflow; May 23, 2018; Retrieved from the Internet: URL:https://stackoverflow.com/questions/50490346/interleaving-multiplexing-compressed-streams; 2 pages.

Han Song et al; "EIE: Efficient Inference Engine on Compressed Deep Neural Network"; 2013 21st International Conference on Program Comprehension (ICPC) [International Symposium on Computer Architecture. (ISCA)], IEEE, US, Jun. 18, 2016; pp. 243-254.

Perkins C et al; "Effects of interleaving on RTP header compression", Infocom 2000. Nineteenth Annual Joint Conference of the IEEE Computer and Communications Societies. Proceedings. IEEE Tel Aviv, Israel Mar. 26-30, 2000, Piscataway, NJ, USA, IEEE, US, vol. 1; Mar. 26, 2000, pp. 111-117.

* cited by examiner

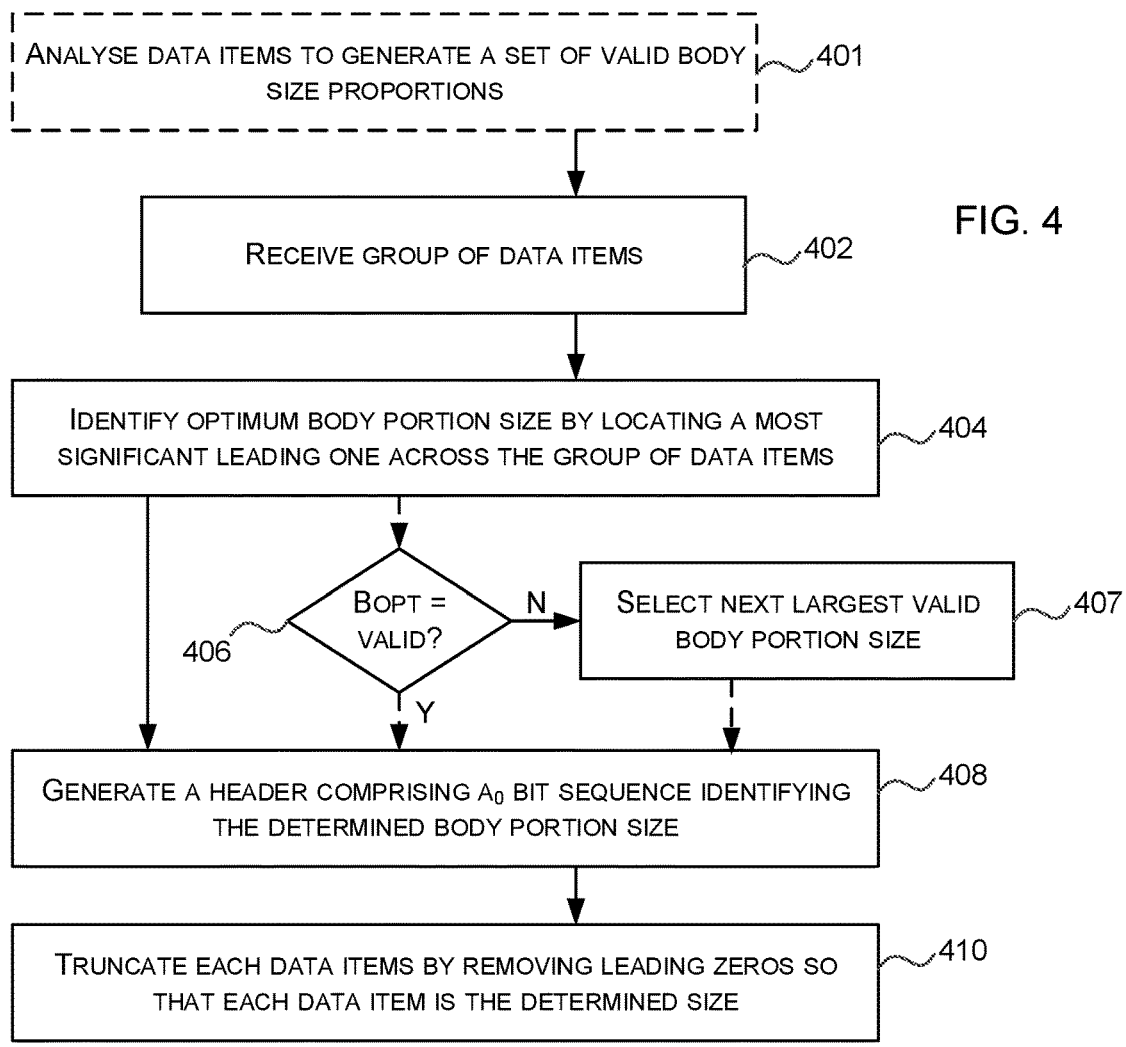

| Body Portion Size | Header Value |
|---|---|
| 0 | 000 |
| 1 | 001 |
| 2 | 010 |
| 4 | 011 |
| 5 | 100 |
| 6 | 101 |
| 7 | 110 |
| 8 | 111 |

| Body Portion Size | Header Value |
|---|---|
| 0 | 000 |
| 1 | 001 |
| 2 | 010 |
| 3 | 011 |
| 4 | 100 |
| 6 | 101 |
| 7 | 110 |
| 8 | 111 |

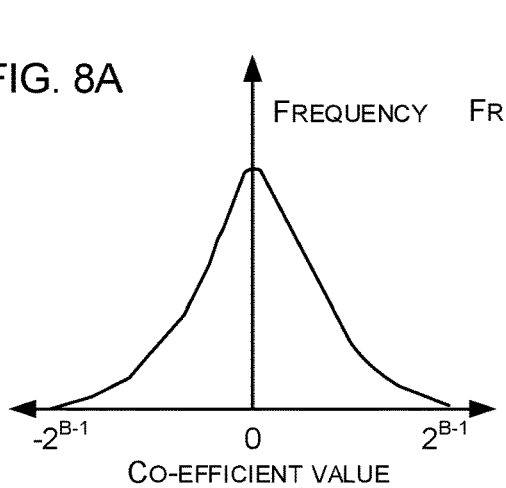
FIG. 8A
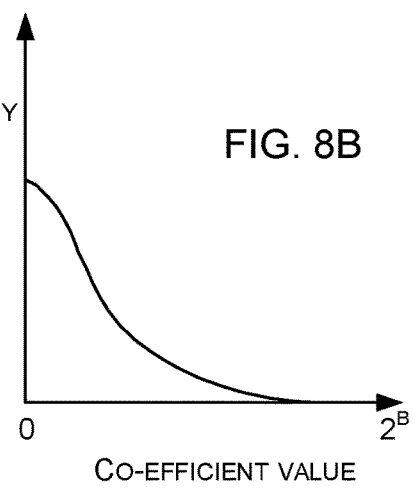
FIG. 8B
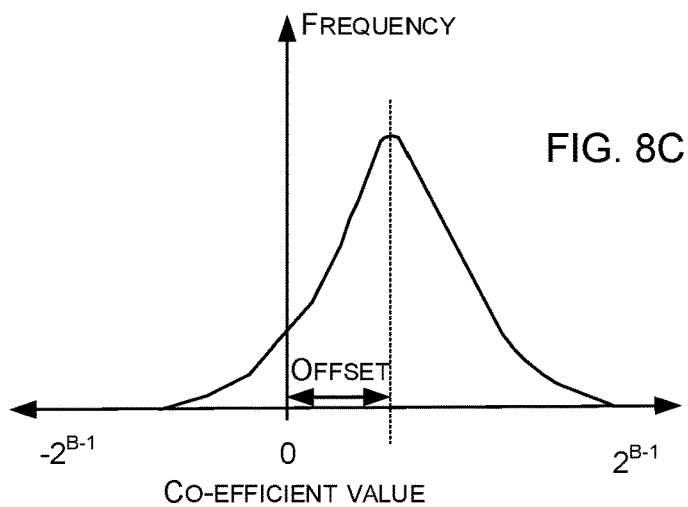
FIG. 8C
FIG. 9
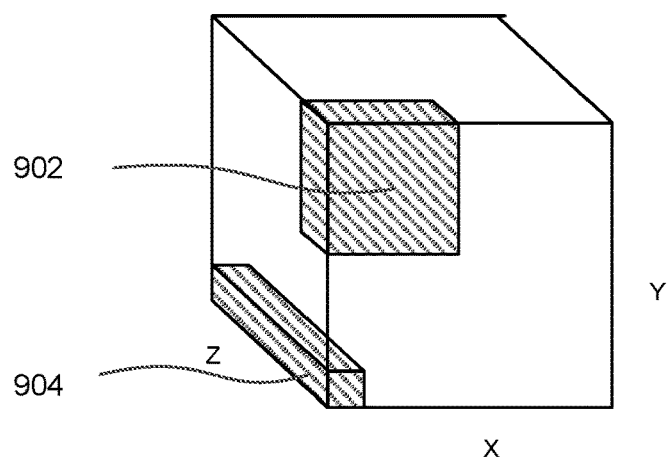

DATA COMPRESSION AND STORAGE

BACKGROUND

Convolutional neural networks (NN) may comprise an input layer, an output layer and multiple hidden layers. For each layer in the NN an array of weights, or coefficients, (e.g. a multi-dimensional array of weights) is computed in advance (e.g. as part of training stage) and stored in memory so that they can be used at run time, when they are applied to the input data (which may also be a multi-dimensional array of data). The arrays of weights may be defined as having a size of x*y*z, where x and y may be the same or different for different layers (e.g. dependent upon whether padding is used) and the depth of the array, z, is typically different for different layers. For the input layer, the depth of the array of weights may be small (e.g. a depth of two) but for other layers, particularly towards the end of the NN, the depth may be much larger (e.g. over 100 or over 1000 and depths of 4000+ in a later layer have been known). At run time, these weights are read from the memory.

The embodiments described below are provided by way of example only and are not limiting of implementations which solve any or all of the disadvantages of known methods of handling data.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods of data compression and decompression are described. These methods can be used to compress/decompress the weights used in a neural network. The compression method comprises encoding groups of data items by generating, for each group, header data comprising h-bits and a plurality of body portions each comprising b-bits and each body portion corresponding to a data item in the group. The value of h may be fixed for all groups and the value of b is fixed within a group, wherein the header data for a group comprises an indication of b for the body portions of that group. In various examples, b=0 and so there are no body portions. In examples where b is not equal to zero, a body data field is generated for each group by interleaving bits from the body portions corresponding to data items in the group. The resultant encoded data block, comprising the header data and, where present, the body data field can be written to memory.

A first aspect provides a method of data compression comprising: receiving a plurality of data items; encoding groups of data items by generating, for each of the groups, header data comprising h-bits and a plurality of body portions each comprising b-bits and each of the body portions corresponding to a data item in the group, wherein b is fixed within a group and wherein the header data for a group comprises an indication of b for the body portions of that group; generating, for each of the groups where b>0, a body data field for the group by interleaving bits from the body portions corresponding to data items in the group; and storing one or more encoded data blocks comprising the header data and the body data fields.

A second aspect provides a method of data decompression comprising: receiving one or more blocks of data, the one or more blocks of data encoding one or more groups of data items; reading header data into a first buffer; reading body data into a second buffer; and for each of the encoded groups of data items: reading header data for the group from the first buffer, wherein the header data for a group of data items comprises a h-bit indication of a body portion size, b, for the group of data items, wherein b is fixed within a group; determining the body portion size, b, for the group of data items from the header data; reading a body data field from the second buffer based on the determined body portion size, the body data field comprising interleaved body portions, with one body portion for each of the data items in the group; decoding the body data field to generate the decoded data items, the decoding comprising de-interleaving the body portions, wherein each of the decoded data items comprises n bits, where n≥b; and outputting the decoded data items.

A third aspect provides a data compression apparatus comprising: an input for receiving a plurality of data items; an encoding module configured to encode groups of data items by generating, for each of the groups, header data comprising h-bits and a plurality of body portions each comprising b-bits and each of the body portions corresponding to a data item in the group, wherein b is fixed within a group and wherein the header data for a group comprises an indication of b for the body portions of that group; an interleaving module configured to generate a body data field for each of the groups by interleaving bits from the body portions corresponding to data items in the group; and a memory interface configured to output, for storage, one or more encoded data blocks comprising the header data and the body data field.

A fourth aspect provides a data decompression apparatus comprising: one or more inputs for receiving one or more blocks of data, the one or more blocks of data encoding one or more groups of data items; a header read module configured to read header data into a first buffer; a body read module configured to read body data into a second buffer; and a decoding module configured, for each of the encoded groups of data items, to: read header data for the group from the first buffer, wherein the header data for a group of data items comprises a h-bit indication of a body portion size, b, for the group of data items, wherein b is fixed within a group; determine the body portion size, b, for the group of data items from the header data; read a body data field from the second buffer based on the determined body portion size, the body data field comprising interleaved body portions, with one body portion for each of the data items in the group; decode the body data field, comprising de-interleaving the body portions (704), to generate the decoded data items, wherein each of the decoded data items comprises n bits, where n≥b; and output the decoded data items.

A fifth aspect provides a compression apparatus comprising: an input configured to receive weights to be used in a neural network; a compression module configured to compress the weights; and a memory interface configured to output the compressed weights for storage.

A sixth aspect provides a hardware implementation of a neural network, the hardware implementation comprising decompression apparatus comprising: an input configured to receive compressed weights to be used in the neural network; and a decompression module configured to decompress the compressed weights; wherein the hardware implementation is configured to use the decompressed weights in the neural network.

A seventh aspect provides a method of compressing weights to be used in a neural network.

An eighth aspect provides a method of decompressing weights to be used in a neural network.

A ninth aspect provides computer readable code configured to cause any of the methods described herein to be performed when the code is run.

The data compression or data decompression apparatus as described herein may be embodied in hardware on an integrated circuit. There may be provided a method of manufacturing, at an integrated circuit manufacturing system, a data compression or data decompression apparatus as described herein. There may be provided an integrated circuit definition dataset that, when processed in an integrated circuit manufacturing system, configures the system to manufacture a data compression or data decompression apparatus as described herein. There may be provided a non-transitory computer readable storage medium having stored thereon a computer readable description of an integrated circuit that, when processed, causes a layout processing system to generate a circuit layout description used in an integrated circuit manufacturing system to manufacture a data compression or data decompression apparatus as described herein.

There may be provided an integrated circuit manufacturing system comprising: a non-transitory computer readable storage medium having stored thereon a computer readable integrated circuit description that describes the data compression or data decompression apparatus as described herein; a layout processing system configured to process the integrated circuit description so as to generate a circuit layout description of an integrated circuit embodying the data compression or data decompression apparatus as described herein; and an integrated circuit generation system configured to manufacture the data compression or data decompression apparatus as described herein according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which:

FIG. 4 is a flow diagram of an example encoding method that may be used in the method of FIG. 1A;

FIG. 5 is a schematic diagram of a group of data items that may be encoded using the method of FIG. 4;

FIG. 8A is a graph of a first example distribution of data items;

FIG. 8B is graph of an example distribution of pre-processed data items;

FIG. 8C is a graph of a second example distribution of data items;

FIG. 9 is a schematic diagram of a multi-dimensional array of data;

Figure 1A:
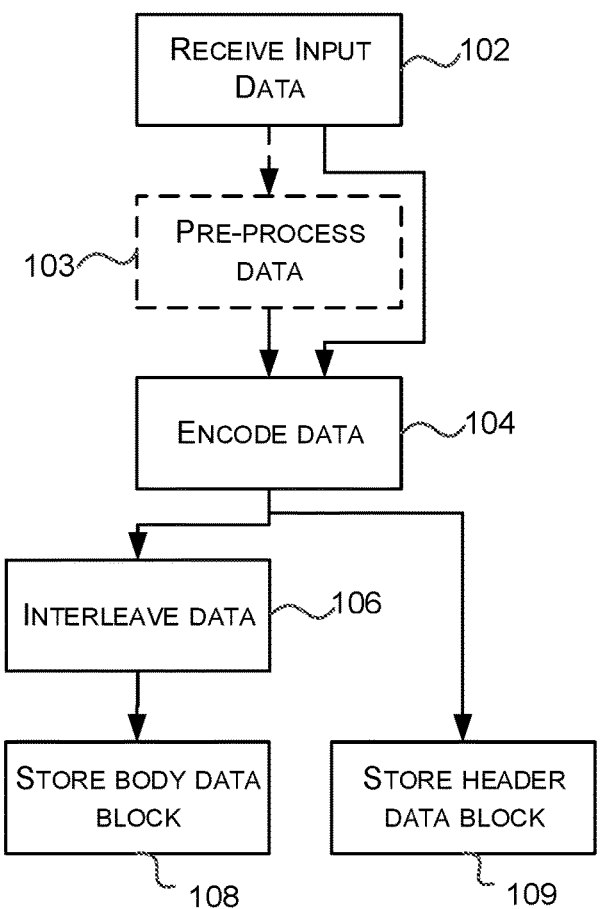
FIG. 1A is a flow diagram of an improved data compression method.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only.

As described above, an array of weights for a neural network (e.g. a convolutional NN) can be very large and as these are stored in memory, rather than a local cache, a significant amount of system bandwidth is used at run time to read in the weight data (e.g. 50% of the system bandwidth in some examples). In order to reduce the amount of bandwidth that is used, the weights may be stored in a compressed form and then decompressed prior to use (and after having been read from memory).

Described herein is an improved method of data compression that involves interleaving the compressed data in such a way that the decompression can be performed efficiently (e.g. a reduced area of hardware is needed to perform the decompression and the decompression process has reduced latency and power consumption). Whilst the methods of compression and decompression that are described herein may be used for an array of weights for a neural network (e.g. a convolutional NN), the methods may also be applied to other data. In various examples the methods may be applied to any multi-dimensional array of data, including, but not limited to, image data, voice data, etc.; however the methods are also applicable to 1D data. In various examples, the methods described herein may be used to compress the data (i.e. the results) output by a layer within a neural network (e.g. a layer within a convolutional NN). This then provides a saving in system bandwidth when the data is subsequently read in (as input data) to the next layer in the neural network.

As described in detail below, the data compression method comprises encoding groups of data items (e.g. binary numbers) using an encoding method that generates header data for each group and, except where a group comprises only zeros, body data for each group. In the examples described herein, the header data for each group comprises a fixed number of bits (e.g. h bits for each group, where h is fixed), whereas the body data may differ in size for different groups (e.g. B bits of body data for each group, where B is variable) and in an extreme case there may be no body data for a group (e.g. B=0). If each input data item comprises n bits and each group comprises N numbers, the input data for a group (i.e. the uncompressed data) comprises n*N bits whereas the compressed data for the group comprises h+B bits, and if the compression is successful (h+B)≤(n*N). Like any other data compression method, there may be a few cases where no compression is possible (in which case (h+B) may be larger than (n*N). In some examples these cases may be identified and the data items stored in their original format. Alternatively, as compression is still achieved (on average) when looking across many groups (e.g. across weights for a layer within a convolutional NN or other type of NN), the lack of compression in rare isolated groups may be accommodated. The body data for a group comprises the same number of bits, b bits, of body data for each number in the group (where b≤n and B=b*N), but the number of body bits may differ between groups and as detailed above, in an extreme case there may be no body bits for a particular group (e.g. b=B=0). The data compression method described herein further comprises packing the compressed body data for a group into a body data field in a data block. In this example, the body data field for a group comprises interleaved bits from the body data for each data item in the group. For example, the body data field comprises the least significant bit (LSB) of body data for each data item of the group, followed by the next least significant bit of body data for each data item of the group, etc., until all body bits have been packed into the body data field. In various examples the data block comprises body data fields for each of a plurality of groups and the header bits may be included in a separate data block (that comprises header bits from each of the groups in the plurality of groups). Alternatively a data block may comprise the body data field and the header bits for the same group (e.g. alternating headers and body data fields or a group of headers followed by a group of corresponding body data fields).

Whilst counter-intuitive, by interleaving the body bits as described herein when packing the compressed data for a group into a data block, the decompression is made more efficient and less complex. In particular, the body bits that are required for decompressing any weight (b bits, where b varies between groups) are in the same place in the compressed data block for any value of b. For example, if bit 0 of word 0 is at a position x, bit 1 of word 0 is at position x+N, bit 2 of word 0 is at position x+2N, etc. or more generally, bit J of word K is found at bit position x+(J*N)+K where K∈[0,N−1] and x is the starting position of the body data field (i.e. the position of bit 0 of word 0). These fixed positions within the data block reduce the amount of hardware that is required to perform the decompression (e.g. a multiplexer that would otherwise be required is no longer needed and as a result the decompression hardware is smaller and consumes less power).

Figure 1B:
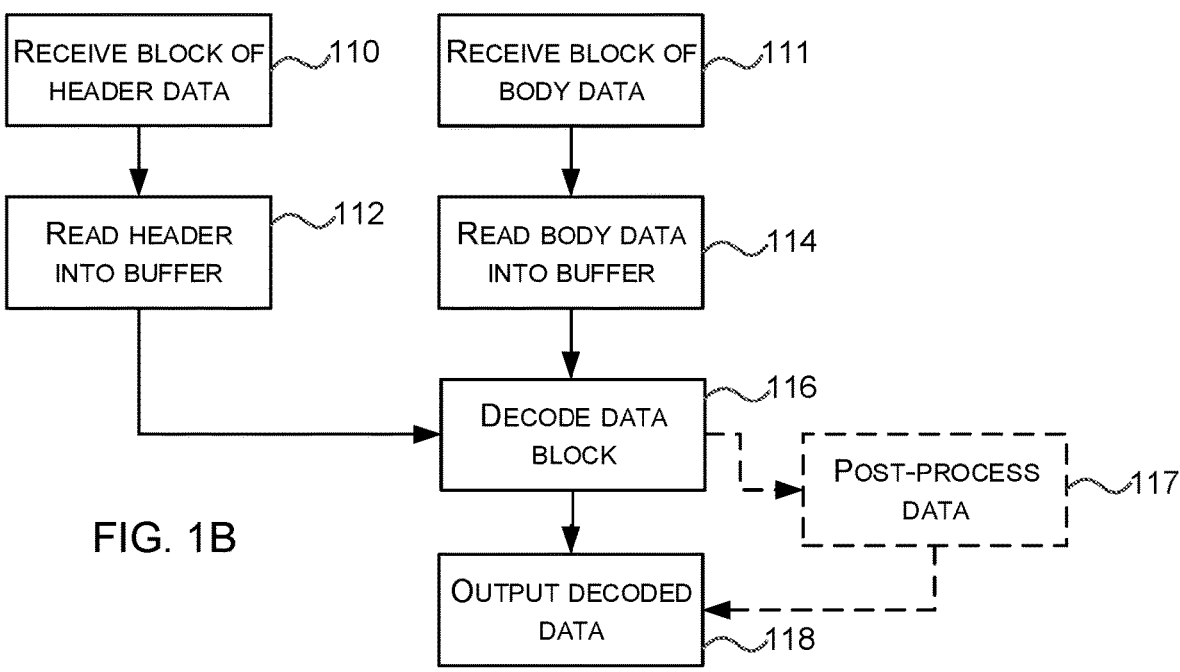
FIG. 1B is a flow diagram of a corresponding data decompression method.

FIG. 1A is a flow diagram of an improved data compression method and FIG. 1B is a flow diagram of the corresponding data decompression method. As described above, these methods may be used for arrays of weights for a neural network (e.g. a convolutional NN) or for any other data, including other arrays of multi-dimensional data. Where the data comprises an array of weights for a neural network (e.g. a convolutional NN), the data that is compressed may be the entirety of the weight (e.g. where it is in fixed point format) or, where the weight is in a floating point format with all weights having the same exponent, the data that is compressed may be the n-bit mantissas of the weights. Any reference to a 'weight' in the following description may refer either to the entire weight or to the mantissas of the weights where the weights have common exponents.

As shown in FIG. 1A, the data compression method comprises receiving the input data (block 102), e.g. the weights for a convolution NN, image data or other multi-dimensional data (e.g. as shown graphically in FIG. 9). The input data may be received (in block 102) in chunks of data or as an input stream of data items. As described below, the data compression method operates on groups of data items from the input data. In some examples, the input data may be pre-processed (block 103) and this is described in more detail below with reference to FIGS. 8A-8O. This pre-processing, where implemented, operates on a plurality of data items, e.g. on all the input data or on a subset of the input data (e.g. a chunk or group of input data, where a chunk of input data may be the same as, or different from, a group of data items).

The input data (i.e. either pre-processed input data or the original input data) is then encoded (block 104) using a method that generates, for a group of input data items (e.g. binary numbers), a header for the group and in most cases body data for each of the data items, although in extreme cases where all the data items are zero, there will be no body data. The encoding operates on groups of data items, although it will be appreciated that in various examples, multiple groups of data items may be encoded in parallel. As detailed above, the header has a fixed size for all groups (e.g. h bits for each group, where h is fixed) and the body data for each of the data items is the same for all data items within a group (e.g. b bits of body data per data item, where b≥0) but may differ between groups (e.g. b is fixed within a group but is not fixed between groups). The header comprises an indication of the size of the body portion for each data item (e.g. the value of b) and in some examples the header may indicate that the size of the body portion is zero (b=0) in which case there are no body portions for the data items in the group and hence no body data field for the group. Having encoded a group of data items (in block 104), the body bits for the group are packed into a body data field in a data block by interleaving the body bits for each of the data items in the group (block 106, as described below with reference to FIG. 2). The resulting body data block, which may comprise body data fields from multiple groups is then stored or otherwise output (block 108). The header bits may be packed into a separate data block (e.g. into a header field for the group) and the resulting header data block, which may comprise header fields from multiple groups, is then stored or otherwise output (block 109). When storing the data blocks (in blocks 108 and 109), they may be byte aligned rather than necessarily being stored adjacent to the immediately previously stored data block. This simplifies addressing given that the size of a data block varies between groups of data items.

In various examples the bit depth of the data items, n (which is fixed) is between 4 and 16 and in various examples n=8 or n=16. In various examples the number of data items in a group, N, is 4 or 8. In examples where N=8, this may result in less complex hardware than where N=4. This is because the multiplexing logic becomes less complex as N increases because the possible starting positions of a new body data field within a body data block reduces. For example, if N=4, each group is guaranteed to start on every 4th bit and cannot start on any of the bit positions between, whereas if N=8, each group can only start every 8th bit and this removes layers from a multiplexing tree because the tree does not need the ability to select any of the intervening values. In contrast, by using smaller values of N (i.e. fewer data items in a group), the amount of compression that may be achieved may be increased (i.e. the body portion size may be reduced); however, the number of encoded groups of data items, and hence header fields, is increased and this may outweigh any benefits achieved as a consequence of the smaller body data field. Therefore there is a trade-off to consider when deciding what value to use for N.

Figure 2:
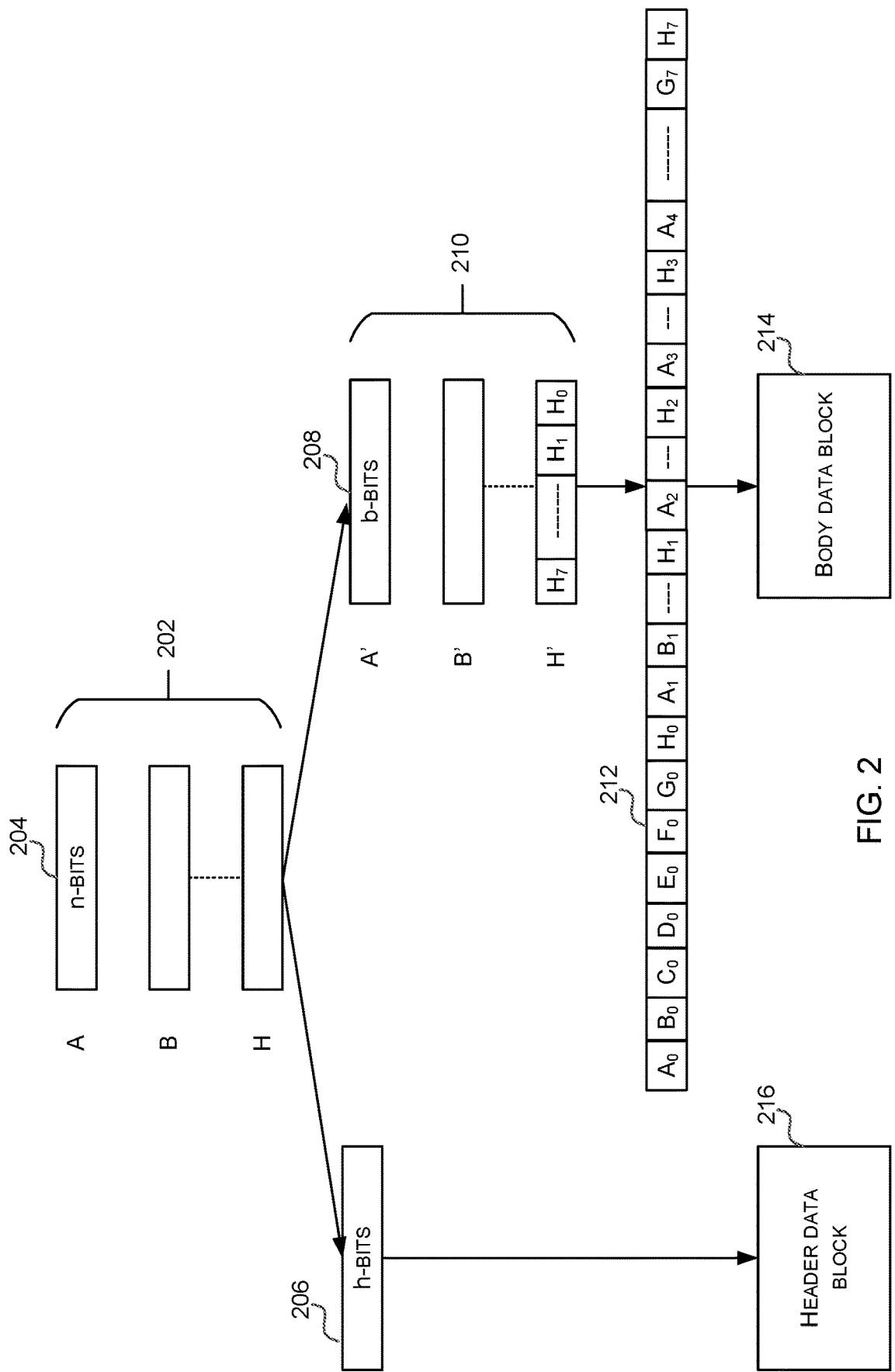
FIG. 2 is a schematic diagram that shows an example of the encoding and interleaving operations from the method of FIG. 1A.

FIG. 2 is a schematic diagram that shows an example of the encoding and interleaving operations (blocks 104 and 106) from FIG. 1A for N=8 (i.e. N data items per group). As shown in FIG. 2, a group of data items 202 from the input data comprises 8 data items (N=8) 204. The encoding operation (in block 104) generates, from the 8 data items, one header 206 (comprising h-bits) for the group and if b>0, one body portion 208 for each data item in the group (as noted above, if b=0 then there are no body portions for the data items in the group). The header 206 comprises an indication of the size of the body portion 208 for each data item (e.g. the indication could represent the value of b, or in some examples the indication could represent the value of B where the value of b can easily be determined from B, as b=B/N). Each body portion 208 comprises b-bits and in the example shown in FIG. 2, b=8. If there are body portions (i.e. b>0), bits from the body data 210 for each of the data items are then interleaved (in block 106). As shown in FIG. 2, the interleaving forms a body data field 212 by first adding one bit from each body portion 208, then adding a next bit from each body portion etc. In the example shown, the least significant bit (LSBs) of body data for each data item is first added (bits $A_0$, $B_0$, $C_0$, $D_0$, $E_0$, $F_0$, $G_0$, $H_0$) followed by the next least significant bit of body data for each data item of the group (bits $A_1$, $B_1$, $C_1$, $D_1$, $E_1$, $F_1$, $G_1$, $H_1$), etc., until all body bits have been packed into the body data field. As shown in FIG. 2, the last bit in the body data field is the most significant bit (MSB) of the body data for the last data item in the group (bit $H_7$). In other examples, the MSBs (bits $A_7$, $B_7$, $C_7$, $D_7$, $E_7$, $F_7$, $G_7$, $H_7$) may be packed first, followed by the next most significant bit, etc. until all the bits of body data 210 have been packed into the body data field 212. Having generated the body data field 212 by interleaving (in block 106), the body data field is packed into a body data block 214 and the header 206 is packed into a header data block 216.

By storing the headers and body data fields in different data blocks 216, 214, the decompression operation is made less complex. Within the header data block, the location of the start of each header is fixed (because the header size is the same for all groups) and so the headers can be read easily to determine the offsets for the starting positions of each body data field 212 within the body data block 214.

In various examples, instead of storing the header and body data fields in separate data blocks, a data block may comprise K headers (i.e. the headers 206 for K groups) followed by the corresponding K body data fields. By selecting K such that K*h has the same bit alignment properties as the body data fields, e.g. K*h=0 mod N, the alignment of bits within the resultant data block also reduces the complexity of the decompression operation.

Whilst the description above refers to interleaving bits starting with the LSB of body data for each data item in the group, in other examples, the interleaving may start with the MSB of body data for each data item in the group. The selection of whether to start with the LSB or MSB depends on the encoding scheme that is used (in block 104). Where an encoding scheme as described below with reference to FIG. 4 is used, starting with the LSB is most appropriate. However, if the encoding scheme is a lossy compression scheme that removes one or more LSBs, then interleaving starting with the MSB of body data may be used instead. Similarly, if the decoding scheme uses online arithmetic (instead of binary multipliers and adders, as is the case in the examples described below), interleaving starting with the MSB may be used because online arithmetic performs calculations starting with the MSB.

The interleaving that is performed on the body bits (in block 106) reduces the complexity of the decompression operation and this can be described with reference to FIGS. 1B and 3.

FIG. 1B is a flow diagram of the data decompression method that corresponds to the data compression method shown in FIG. 1A and described above. As shown in FIG. 1B, the method comprises receiving encoded data, where, as described above, the original items are encoded by representing groups of data items with a header and none, one or more body data fields. In various examples, receiving this data may comprise receiving blocks of header data 216 (block 110) and blocks of body data 214 (block 111). These may, for example, be received as two parallel streams and may be read and buffered independently (blocks 112 and 114). Alternatively the header data and body data may be received together (e.g. where the data is stored in the same data block, as described above).

As part of the decode operation (block 116), the header for a group is processed and this indicates the amount of body data that is required to decode the group of data items (i.e. the size of the body data field for the group, B=b*N). The corresponding amount of data can then be extracted from the buffer (of body data) and as a consequence of the fixed bit positions (due to the interleaving operation, as described above), the bits can be shuffled using a fixed scheme (irrespective of the value of b) to re-create the original body portions for each data item in the group without requiring any multiplexer logic. Having recreated the body portions, the body portions are decoded.

Figure 3:
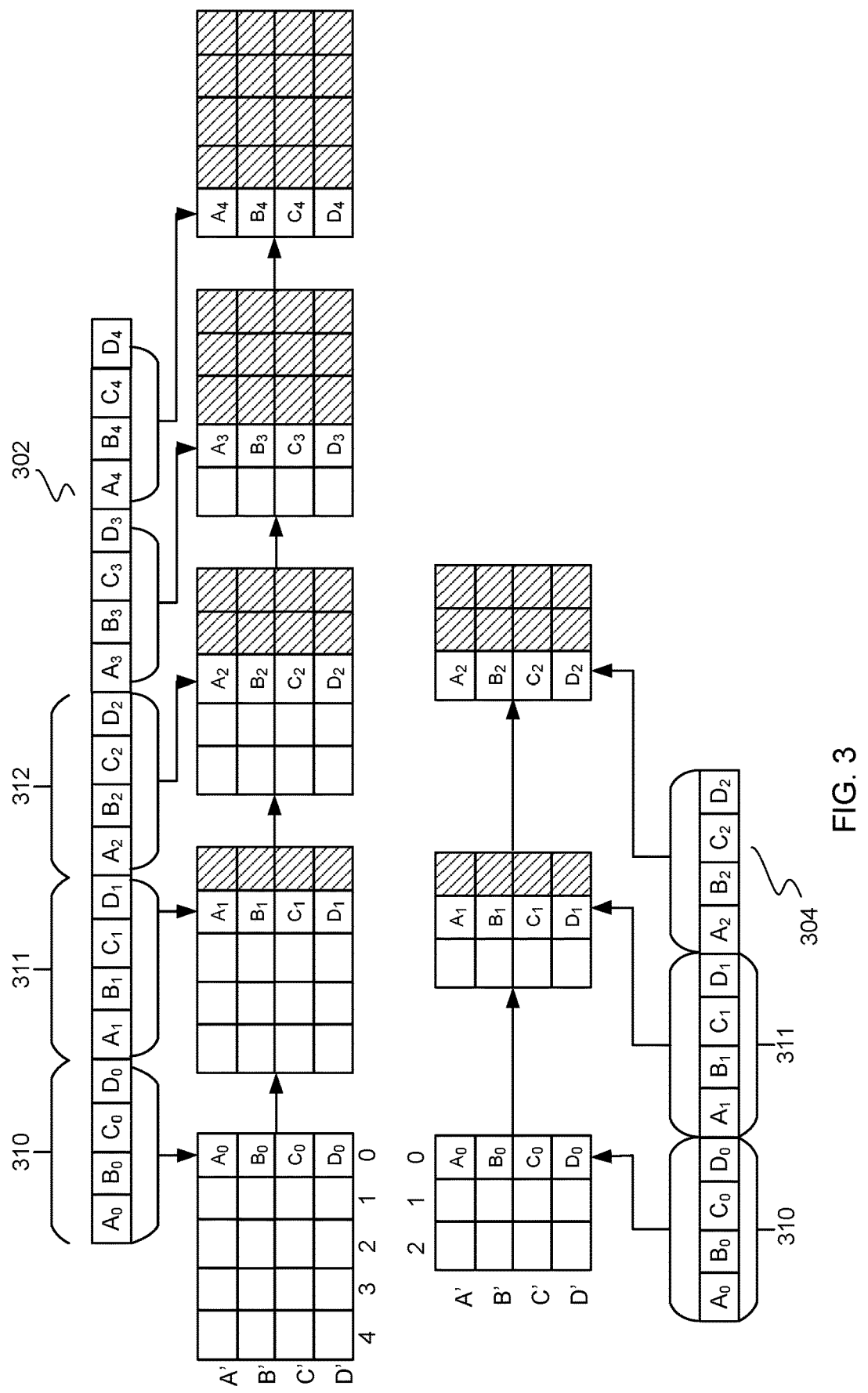
FIG. 3 is a schematic diagram showing two examples of the de-interleaving operation from the method of FIG. 1B.

The fixed relationship between the bit positions in the body data field and the corresponding bit positions in the original data items, irrespective of the number of body bits for each data item in the group (i.e. irrespective of the value of b, which may vary between groups) is shown graphically in FIG. 3 for two different sizes of body data field 302 (b=5), 304 (b=3), and in this example, to reduce the complexity of the diagram, the number of data items in a group is four (N=4). As shown in FIG. 3, irrespective of the size of the body data field (and hence the number of bits in each body portion, b), the first N (i.e. 4) bits in the body data field 302, 304 comprise a single bit for each of the body portions, denoted A'-D'. In the example shown, the first N bits comprise the LSBs for each of the body portions. The next N bits in the body data field 302, 304 comprise the next bit for each of the body portions, again irrespective of the size of the body data field. Consequently, by reading the concatenated sections 310-312 each comprising N bits in turn and building up the body portions one bit per section, until a point is reached where there are no further bits in the body data field 302, 304 (as extracted from the buffer) and at that stage, all the bits of the body portions A'-D' have been identified and deinterleaved.

Once the decoded data block has been generated (in block 116), there is an optional post-processing operation (block 117) which is an inverse of the optional pre-processing operation (block 103) in the compression method (as shown in FIG. 1A). The decoded data, either in its original or post-processed form, is then output (block 118). In various examples, the decoded data may be used immediately. In various examples, the decoded data may not be buffered or stored in a cache because of its large size and instead the decompression may be performed each time the data items are used. However, in some other examples at least some of the decoded data may be stored, e.g. in a cache.

The encoding operation (in block 104) may use any suitable encoding scheme that generates a fixed size header 206 for a group of data items and a body portion for each data item in the group, where the size of the body portion is the same for all data items within a group but may be different for other groups of data items. An example of such an encoding scheme is shown in FIG. 4.

FIG. 4 is a flow diagram of an example encoding method that operates on groups of data items and the method may be described with reference to the example shown in FIG. 5. The encoding method receives a group of data items 502 (block 402), for example, 8 data items 504 (N=8), denoted A-H as shown in FIG. 5. In the example shown in FIG. 5, each of the data items 504 comprises 8 bits (n=8). The optimum size of body portion (i.e. the optimum value of b, $b_{opt}$) is then identified by identifying the most significant leading one across the group of data items (block 404). The most significant leading one may, for example, be identified by determining the bit position of the leading one in each data item (where the bit positions may be identified by the bit index 0-7, as shown in FIG. 5) and comparing these values to identify the highest bit index. The optimum size of body portion is one more than the highest bit index, in examples where the LSB has a bit index of zero (as shown in FIG. 5). Alternatively, the bit position of the most significant leading one across the group of data items may be identified in any other way (in block 404). In the example shown in FIG. 5, data item A has the leading one in bit position 4, as do data items E and H. All other data items in the group have their leading ones in lower bit positions (i.e. less significant bit positions). Consequently, in the example shown in FIG. 5, the optimum body portion size is 5 bits ($b_{opt}$=5). If all of the data items only comprise zeros, then the optimum body portion size is also zero ($b_{opt}$=0).

Having identified an optimum body portion size (in block 404) and in examples where all body portion sizes from zero to n, i.e. n+1 sizes, can be encoded within the h-bits of the header, the method may continue by generating a header comprising a bit sequence that encodes the identified optimum body portion size (block 408) and truncating each data item to create a corresponding body portion by removing none, one or more leading zeros from the data item, until the body portion has the optimum body portion size (i.e. n-$b_{opt}$ leading zeros are removed such that the resulting body portion comprises $b_{opt}$ bits). If the optimum body portion size is zero ($b_{opt}$=0) and then n leading zeros are removed and there are no remaining body bits. In various examples, a look up table may be used to identify the bit sequence used for a particular body portion size or the body portion size may be included in the header as a binary number.

In various examples, however, the size of the header (i.e. the number of bits, h, in the header) may be insufficient to identify all of the possible body portion sizes, i.e. n+1 sizes. In particular, this may occur where the bit depth of the input data (i.e. the value of n) is a power of two. Referring to the example in FIG. 5, there are nine possible body portion sizes since n=8 (i.e. body portion sizes of 0, 1, 2, 3, 4, 5, 6, 7, 8) and if the header only comprises three bits (h=3), then only eight body portion sizes can be represented in the header bits (using binary values 0-7) and hence there are only eight valid body portion sizes. In other examples, more than one body portion size may be considered invalid in order to reduce the overall header size. For example, if n=9 and h=3 then two body portion sizes may be considered invalid.

In examples where one or more body portion sizes are not valid, having determined the optimum body portion size (in block 404), the method checks whether the optimum body portion size, $b_{opt}$, is valid (block 406). If the optimum body portion size is valid (Yes' in block 406), then the method continues by encoding that valid optimum body portion size into the header (in block 408) and truncating each data item to create a corresponding body portion by removing none, one or more leading zeros from the data item, until the body portion has the optimum body portion size (i.e. n-$b_{opt}$ leading zeros are removed such that the resulting body portion comprises $b_{opt}$ bits). If, however, the optimum body portion size is not valid (No' in block 406), the next largest valid body portion size, $b_{valid}$, is selected (block 407). The method then continues by encoding that valid body portion size into the header (in block 408) instead of the optimum body portion size and truncating each data item to create a corresponding body portion by removing none, one or more leading zeros from the data item, until the body portion has the valid body portion size (i.e. n-$b_{valid}$ leading zeros are removed such that the resulting body portion comprises $b_{valid}$ bits). Again, a look up table may be used to identify the bit sequence used for the selected valid body portion size (which may be equal to the optimum body portion size, $b_{opt}$, or the next larger valid body portion size, $b_{valid}$), and two example look up tables are shown in FIGS. 6A and 6B.

Figures 6A, 6B, 7A:
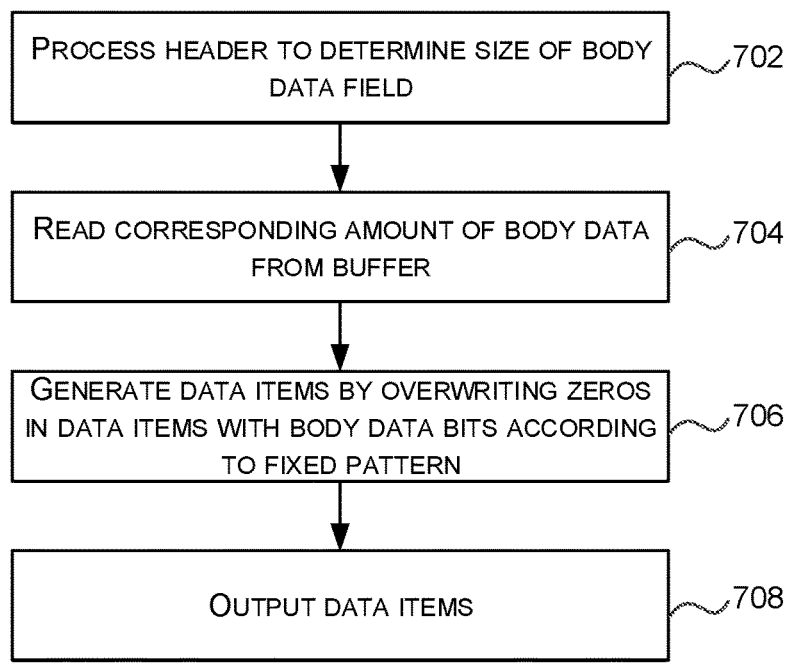
FIGS. 6A and 6B show two example look up tables for body portion sizes.
FIG. 7A is a flow diagram of a first example decoding method that may be used in the method of FIG. 1B.

In the example look up table shown in FIG. 6A, the body portion size which is omitted, and hence is not considered valid, is three and in the example look up table shown in FIG. 6B, the body portion size which is omitted, and hence is not considered valid, is five. The body portion size that is considered invalid may be chosen for omission based on analysis of the input data (e.g. on many or all groups of data items) and this is shown as an optional initial analysis step in FIG. 4 (block 401). The analysis (in block 401) determines, based on a plurality of groups of data items, which optimum body portion size is least common and then allocates header values to body portion sizes omitting that least common size. In various examples, where the input data comprises weights for a neural network (e.g. a convolutional NN), the omitted body portion size may be identified separately for each layer of the NN based on analysis of the weights which are most commonly used for that layer (in block 401) and in particular based on the least common position of a leading one across all the weights (or across all the n-bit mantissas of the weights) for the particular layer of the NN. In this way, different layers may have different body portion sizes that are considered invalid. For example, one layer of a NN may have three as the invalid body portion size (as in FIG. 6A) and another layer of the same NN may have five as the invalid body portion size (as in FIG. 6B). As noted above, in various examples there may be more than one invalid body portion size and these multiple invalid body portion sizes may be selected based on the least common positions of leading ones across the input data (i.e. the least common optimum body sizes for the groups of data items), e.g. across all the weights (or mantissas of the weights) for a particular layer of a NN, with the analysis being performed independently for each layer of the NN.

Referring again to the example group of data items 502 shown in FIG. 5, as detailed above the optimum body portion size is 5-bits ($b_{opt}$=5). If the look up table of FIG. 6A is used, this is a valid body portion size ('Yes' in block 406) and the bit sequence '100' is included within the header (in block 408). Additionally, each of the data items are truncated by removing three leading zeros (in block 410) to form the corresponding body portion. If, however, the look up table of FIG. 6B is used, a body portion size of 5-bits is not valid ('No' in block 406) and hence the next largest valid body portion size would be used instead, i.e. a body portion size of six. In this example, the bit sequence '101' is included within the header (in block 408) and each of the data items are truncated by removing two leading zeros (in block 410) to form the corresponding body portions. This means that there is a leading zero in all of the body portions as a consequence of not using the optimum body portion size.

In the first of these examples, where the table of FIG. 6A is used, the resultant encoded data block comprises 3+(8*5)=43 bits, i.e. 3 header bits and 40 body bits (5 for each body portion). In contrast, where the table of FIG. 6B is used, the resultant encoded data block comprises 3+(8*6)=51 bits, i.e. 3 header bits and 48 body bits (6 for each body portion). Assuming that many data blocks are encoded and that the optimum body portion size is rarely invalid, the additional N bits (which are all leading zeros) included in the body portion on those rare occasions (when the optimum body portion size is invalid), will still result in a smaller overall amount of encoded data than an alternative solution of increasing every header by one bit so that all optimum body portion sizes can be validly encoded within the header.

In examples where the encoding method of FIG. 4 is used, the corresponding decoding method that may be used in the data decompression method of FIG. 1B (in block 116), including the fixed-pattern de-interleaving may be as shown in FIG. 7A. As shown in FIG. 7A, the method comprises processing the header to determine the size of the body data field, b*N (block 702) and reading the corresponding amount of data from the body data buffer (block 704). Using the fixed relationship (as described above), the data items can then be generated by starting with a set of data Items comprising only zeros (i.e. n zeros in each data item) and overwriting zeroes in each data item (starting with the LSB) with appropriate bits from the body data field (block 706) and once all the bits that have been read from the buffer (in block 704) have been used to overwrite zeros (in block 706), the resultant decoded data items are output (block 708).

Figure 7B:
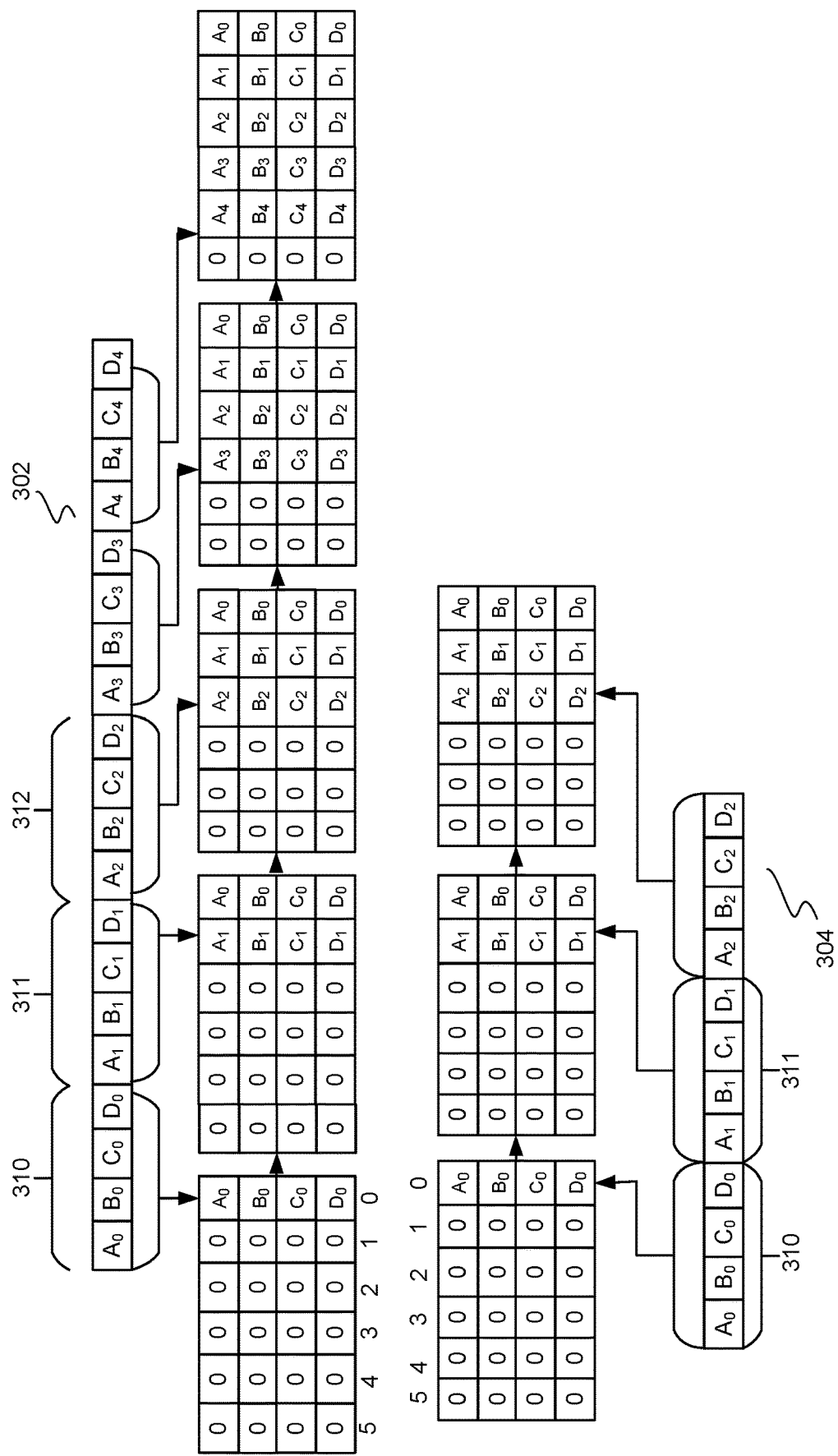
FIG. 7B is a schematic diagram showing two examples of the de-interleaving operation from the method of FIG. 7A.

The decoding method of FIG. 7A is shown graphically in FIG. 7B which is a variation on FIG. 3 (described above) and again the fixed relationship between the bit positions in the body data field and the corresponding bit positions in the original data items, irrespective of the number of body bits for each data item in the group (i.e. irrespective of the value of b, which may vary between groups) is shown for two different sizes of body data field 302 (b=5), 304 (b=3). In this example, to reduce the complexity of the diagram, the number of data items in a group is four (N=4) and the number of bits in each decoded data item is six (n=6). As shown in FIG. 7B, irrespective of the size of the body data field (and hence the number of bits in each body portion, b), the first N (i.e. 4) bits in the body data field 302, 304 comprise a single bit for each of the data items. In the example shown, the first N bits comprise the LSBs for each of the data items and these are used to overwrite the zeros that initially occupy those LSBs. The next N bits in the body data field 302, 304 comprise the next bit for each of the data items, again irrespective of the size of the body data field, and these are used to overwrite the next bit in each of the data items. Consequently, by reading the concatenated sections 310-312 each comprising N bits in turn and overwriting zeros, one zero (for each data item) per N-bit section of the data read from the buffer, until all the bits that have been read have been used, the data items are recreated (i.e. both deinterleaved and decoded). As shown in FIG. 7B, by pre-populating each bit in each data item with a zero (given that the number of bits, n, in each data item is fixed) and then replacing these zeros with values from the body data, there is no need to first recreate the body portions and then, in a separate operation, pad each body portion with the requisite number of leading zeros (as determined based on the header for the group).

Figure 7C:
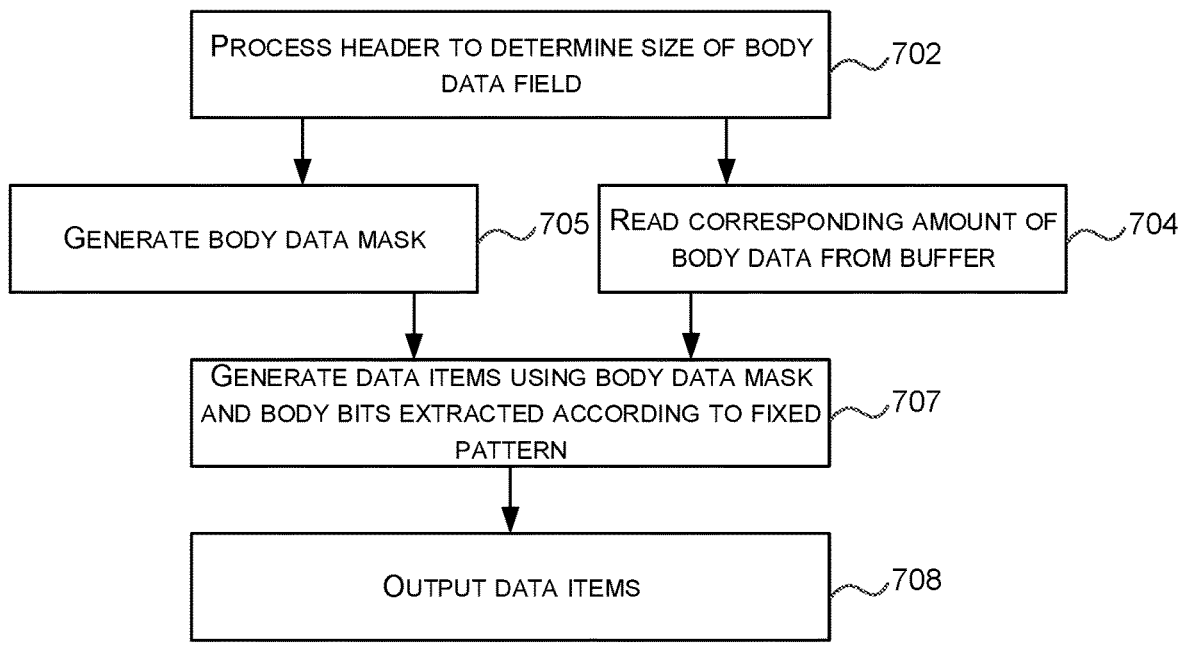
FIG. 7C is a flow diagram of a second example decoding method that may be used in the method of FIG. 1B.
Figure 7D:
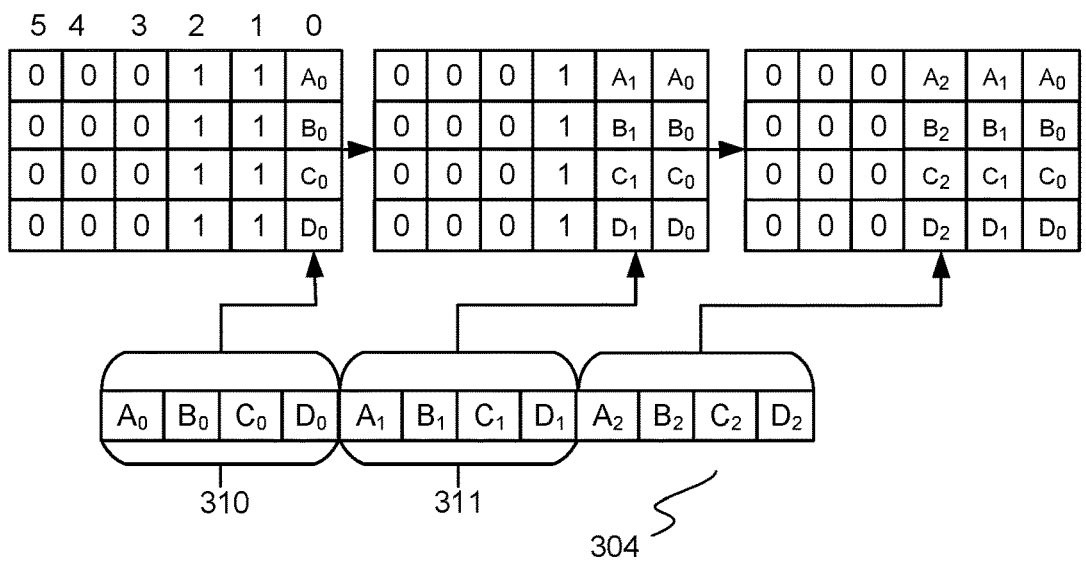
FIG. 7D is a schematic diagram showing an example of the de-interleaving operation from the method of FIG. 7C.

An alternative to the method of FIG. 7A is shown in FIG. 7C and can be described with reference to the example shown in FIG. 7D (for b=3, N=4, n=6). As shown in FIG. 7C, the header data is processed to determine the size of the body data field, b*N (block 702) and this is then used both to read the corresponding amount of data from the body data buffer (block 704) and to generate a body data mask 710 (block 705). The body data mask 710 may comprise ones in positions where valid data can be stored and zeros in all other bit positions and an example is shown in FIG. 7D. The body bits are extracted using the fixed relationship (as described above), the data items can be generated using the body data mask 710 and the body bits (block 707). In various examples, AND gates may be used to combine the body bits and the body mask bits. As before, the resultant decoded data items are output (block 708).

The encoding scheme described above with reference to FIGS. 4, 5, 6A and 6B results in high levels of compression where the data items are small in value (e.g. close to zero) and where the binary representations of each of the data items are similar in terms of the position of the leading ones. For example, if a group of data items was: 0100000, 00000101, 00000100, 00000010, then although a body portion size of 7 bits could be used, the resulting amount of compression is much less than if the group of data items was: 0000111, 00000101, 00000100, 00000010, when a body portion size of 3 bits could be used.

In various examples, such as where the data items are weights for a NN (or the mantissas of those weights), the distribution of the data items may be centred around (or close to) zero, as shown in FIG. 8A. This distribution may, for example, be Gaussian or Laplacian. In such examples, if the data items are represented using two's complement, then the binary strings representing the negative values all have a MSB which is a one and so the encoding method described above cannot remove any leading zeros (e.g. $b_{opt}$=n) and there is no compression. To improve compression or enable compression (e.g. in the case of two's complement representation), the data items are pre-processed (in block 103 of FIG. 1A). The pre-processing operation comprising folding and interleaving the data items so that they are all positive and the distribution is a curve of almost continuously decreasing probability, as shown in FIG. 8B. The folding and interleaving operation can be written mathematically as follows:

$$symbol = \begin{cases} (-2*coeff) - 1, & coeff < 0 \\ 2*coeff, & \text{otherwise} \end{cases}$$

where 'coeff' is the original input data item and 'symbol' is the pre-processed data item. summingng the coefficients are represented in twos complement format, a multiplication by two can be implemented by left shifting by one bit position, and so this may be implemented in hardware (or software) as:

symbol:=isignbitset? (((NOT coeff)<<1) OR 1): coeff<<1;

or symbol:=isignbitset? NOT (coeff<<1): coeff<<1;

where NOT and OR are bitwise operators and <<1 indicates left shifting by one bit position. This essentially converts the data item to a sign magnitude-like format but places the sign bit as LSB. It will therefore be appreciated that if the data items are originally in sign magnitude format, the pre-processing operation may be modified such that it comprises moving the sign bit from the MSB to the LSB.

In various examples, such as for Android NN formatted weights, the data items may not be centred around (or close to) zero and an example distribution is shown in FIG. 8C. In such examples, the offset is subtracted from the input data items as part of the pre-processing operation (in block 103), prior to interleaving and folding, such that a distribution similar to that shown in FIG. 8B is still achieved. An example of the folding and interleaving operation can be written as follows:

$$offset\_coeff = \text{mod}(coeff - \text{offset}, 2^n)$$

$$symbol = \begin{cases} (-2*offset\_coeff) - 1, & off\_coeff < 0 \\ 2*offset\_coeff, & \text{otherwise} \end{cases} \text{ or }$$

symbol := *isignbitset*?((NOT offset_coeff) ≪ 1) OR

1): offset_coeff ≪ 1;

where the function 'mod' computes the remainder of the division when the division is rounded towards negative infinity and in various examples may be equivalent to discarding the MSB. As noted above, multiplying by two can be implemented by left shifting by one bit position.

Wherever a pre-processing operation is applied to the original input data items (in block 103 of FIG. 1A), the inverse operation is applied to the decoded data items before they are output (in block 117 of FIG. 1B). This post-processing operation (in block 117) may therefore comprise an unfolding and de-interleaving operation and optionally the addition of an offset (e.g. so as to reset the distribution from that shown in FIG. 8B to the original distribution, e.g. as shown in FIG. 8A or 8C). Referring to the two examples given above, where the distribution is centred around zero and so no offset is involved:

$$coeff = \begin{cases} -0.5*(symbol+1), & \text{odd}(symbol) \\ 0.5*symbol, & \text{otherwise} \end{cases}$$

And where the distribution is offset:

$$offset\_coeff = \begin{cases} -0.5*(symbol+1), & \text{odd}(symbol) \\ 0.5*symbol, & \text{otherwise} \end{cases}$$

$$coeff = \text{mod}(offset_{coeff} + \text{offset}, 2^n)$$

where in both cases, the halving operation may be performed by right shifting by one bit position. The offset may be communicated separately to the encoded data (e.g. in a command stream) or in any other way (e.g. via a register interface).

In the examples described above, the header has a fixed size for all groups (e.g. h bits for each group, where h is fixed). The size of the header data as a fraction of the overall compressed data size, is small (e.g. half a bit per input data value) and so compression of the header bits is not used. In a variation of the examples described above, however, variable length encoding (e.g. Huffman encoding) may be used for the header data. This may, for example, be used where the header data is biased.

The data compression that may be achieved using the methods described herein may be further improved by increasing the number of data items that comprise only zeros. In examples where the data items are NN weights, this may be achieved by using pruning when training the NN.

The data compression that may be achieved using the methods described herein may be further improved by grouping correlated data items, i.e. data items that are likely to have a similar value and hence a similar position of the leading one. For example, by grouping N data items with a leading one in bit positions 6 and 7 and grouping N data items with a leading one in bit positions 3 and 4, more compression can be achieved than if both groups of data items comprise a mixture of data items with leading ones in bit positions 3, 4, 6 and 7. This may be achieved, for example, by changing the way that the multi-dimensional input data, shown graphically in FIG. 9, is divided into groups. In examples where the data items are NN weights, this may be achieved by grouping weights that relate to the same plane (e.g. weights for different x, y values but the same z value, 902) instead of grouping weights that relate to different planes (e.g. weights for the same x,y value but different z values, 904).

The data compression and decompression methods described herein may be implemented in software, in hardware or in a combination of software and hardware. In various examples, the data compression method described herein may be implemented in software when mapping a NN to particular hardware (or a particular hardware type) and this is often a one-time operation. In contrast, the data decompression method described herein may be implemented at run time and may be performed many times, e.g. whenever the data items are used.

Figure 10:
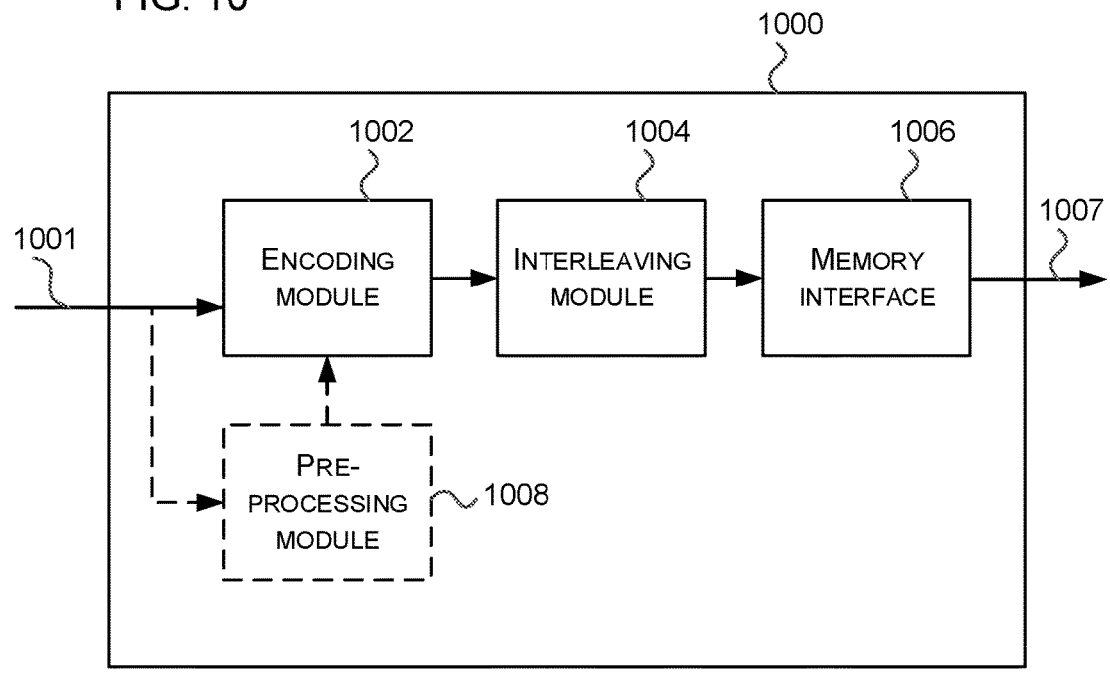
FIG. 10 is a schematic diagram of a data compression apparatus arranged to implement the method of FIG. 1A.

FIG. 10 shows a schematic diagram of a data compression apparatus 1000 arranged to implement the method of FIG. 1A. As shown in FIG. 10, the data compression apparatus 1000 comprises an input 1001, an encoding module 1002, an interleaving module 1004, a memory interface 1006 and an output 1007. The apparatus 1000 may additionally comprise a pre-processing module 1008. The encoding module 1002 is arranged to perform the encoding of the data items (as in block 104) using any suitable encoding method that generates a fixed size header for a group of data items and a body portion for each data item in a group (unless the body portion size, b, is zero). In various examples the encoding module 1002 is arranged to implement the method of FIG. 4. The interleaving module 1004 is arranged to interleave the body bits into the body data field (as in block 106), e.g. as described above with reference to FIG. 2. The memory interface 1006 is arranged to output the encoded data, via the output 1007 for storage in memory (as in block 108). Where provided, the pre-processing module 1008 is arranged to fold and interleave, and optionally subtract an offset, from the input data items (in block 103), as described above with reference to FIGS. 8A-8C. In various examples, the encoding module 1002, interleaving module 1004 and, where provided the pre-processing module 1008, may be implemented in software.

Figure 11:
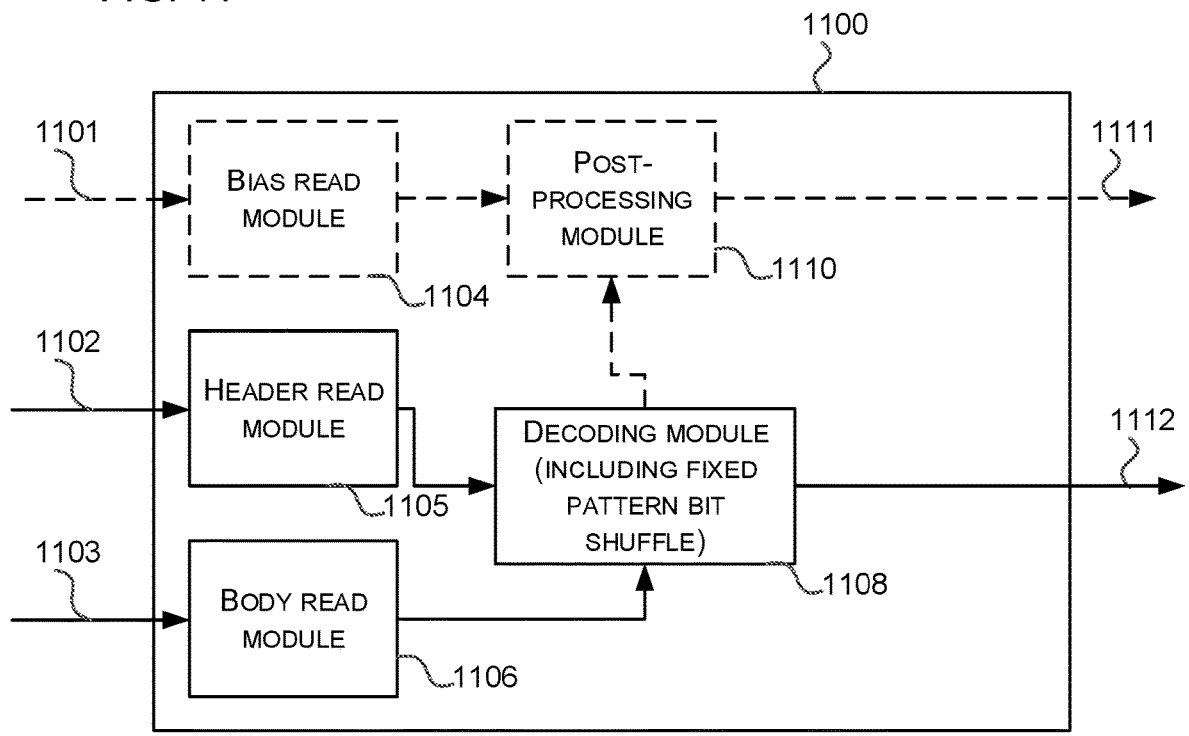
FIG. 11 is a schematic diagram of a data decompression apparatus arranged to implement the method of FIG. 1B.

FIG. 11 shows a schematic diagram of a data decompression apparatus 1000 arranged to implement the method of FIG. 1B. The data decompression apparatus 1100 comprises a plurality of inputs 1101-1103 and a plurality of read modules 1104-1106 each arranged to read a different type of data: header data (in the header read module 1105 via input 1102), body data (in the body read module 1106 via input 1103) and in examples where a bias is used in the NN, a bias (in the bias read module 1104 via input 1101). These read modules 1104-1106 each comprise a buffer (e.g. one or more FIFOs) and requesters (which may be implemented as linear counters) that request data from memory (not shown in FIG. 11) in linear order as long as there is space for the requested data in the corresponding buffer. A prioritization scheme may be implemented to arbitrate between the requesters such that, for example, priority is given to bias requests and then to header requests with body data requests being the lowest priority. This prioritization is in inverse order of the quantity of data required and as a result the biases will never stall (as they will never not have enough data) and the FIFOs in both the bias read module 1104 and header read module 1105 can be narrower. As described above (with reference to FIG. 1B), the decoding module 1108 reads data from the buffers in the header and body read modules 1105, 1106, performs the fixed pattern bit shuffle (as described above with reference to FIG. 3 or 7) and generates the decoded data items which are then either output from the decompression apparatus (via output 1112), or where post-processing is used, are first post-processed in the post-processing module 1110 before being output (via output 1111).

Figure 12:
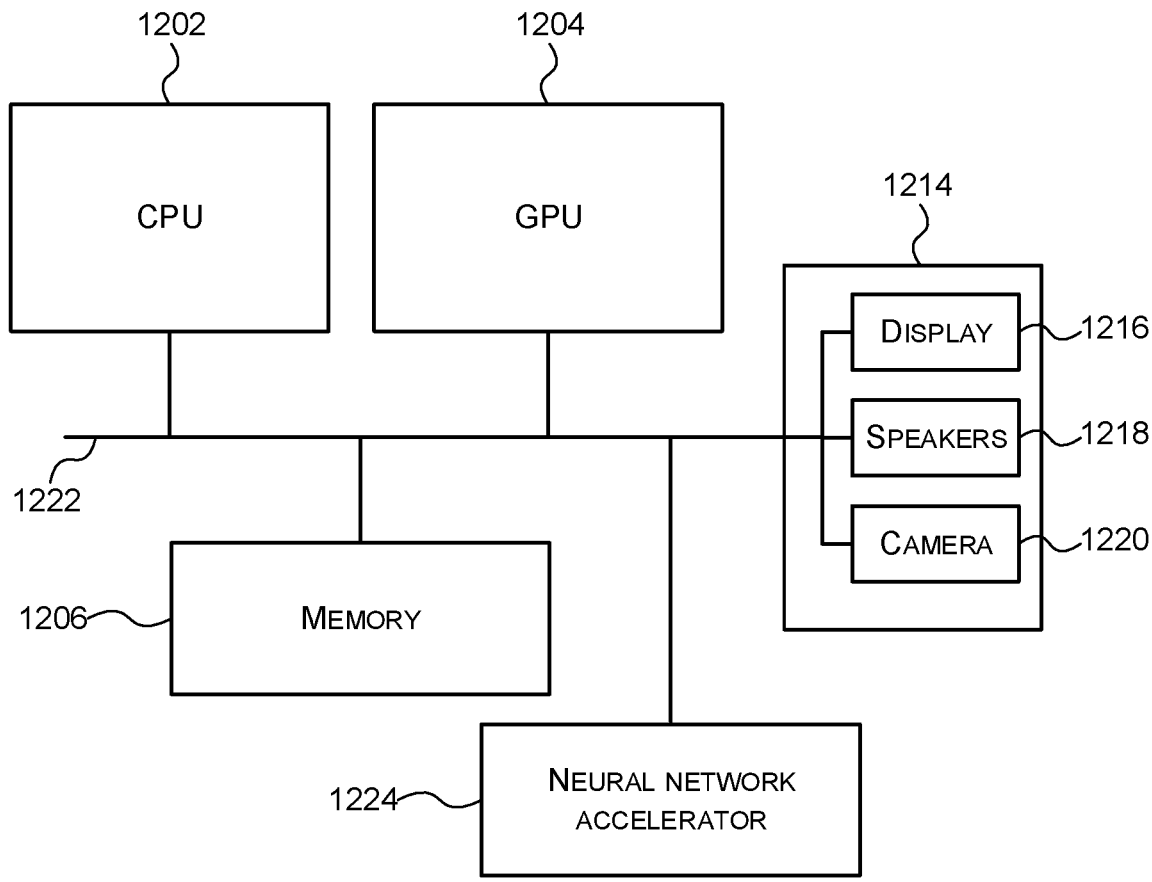
FIG. 12 shows a computer system in which a graphics processing system is implemented.

FIG. 12 shows a computer system in which the methods of data compression or decompression described herein may be implemented. The computer system comprises a CPU 1202, a GPU 1204, a memory 1206 and other devices 1214, such as a display 1216, speakers 1218 and a camera 1220. The components of the computer system can communicate with each other via a communications bus 1220. The system further comprises a neural network accelerator 1224 arranged to implement a method of data compression and/or decompression as described herein. Whilst this neural network accelerator 1224 is shown as a separate hardware unit in FIG. 12, in other examples it may be part of the GPU 1204 and/or may be part of the same SoC (system on chip) as the CPU 1202.

The apparatus of FIGS. 10-12 are shown as comprising a number of functional blocks. This is schematic only and is not intended to define a strict division between different logic elements of such entities. Each functional block may be provided in any suitable manner. It is to be understood that intermediate values described herein as being formed by a module need not be physically generated by the module at any point and may merely represent logical values which conveniently describe the processing performed by the apparatus between its input and output.

The data compression and data decompression apparatus described herein may be embodied in hardware on an integrated circuit. The data compression and data decompression apparatus described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), physics processing units (PPUs), radio processing units (RPUs), digital signal processors (DSPs), general purpose processors (e.g. a general purpose GPU), microprocessors, any processing unit which is designed to accelerate tasks outside of a CPU, etc. A computer or computer system may comprise one or more processors. Those skilled in the art will realize that such processing capabilities are incorporated into many different devices and therefore the term 'computer' includes set top boxes, media players, digital radios, PCs, servers, mobile telephones, personal digital assistants and many other devices.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a data compression or decompression apparatus configured to perform any of the methods described herein, or to manufacture a computing device comprising any apparatus described herein. An integrated circuit definition dataset may be, for example, an integrated circuit description.

Therefore, there may be provided a method of manufacturing, at an integrated circuit manufacturing system, a data compression or decompression apparatus as described herein. Furthermore, there may be provided an integrated circuit definition dataset that, when processed in an integrated circuit manufacturing system, causes the method of manufacturing a data compression or decompression apparatus to be performed.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS® and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a data compression or decompression apparatus will now be described with respect to FIG. 13.

Figure 13:
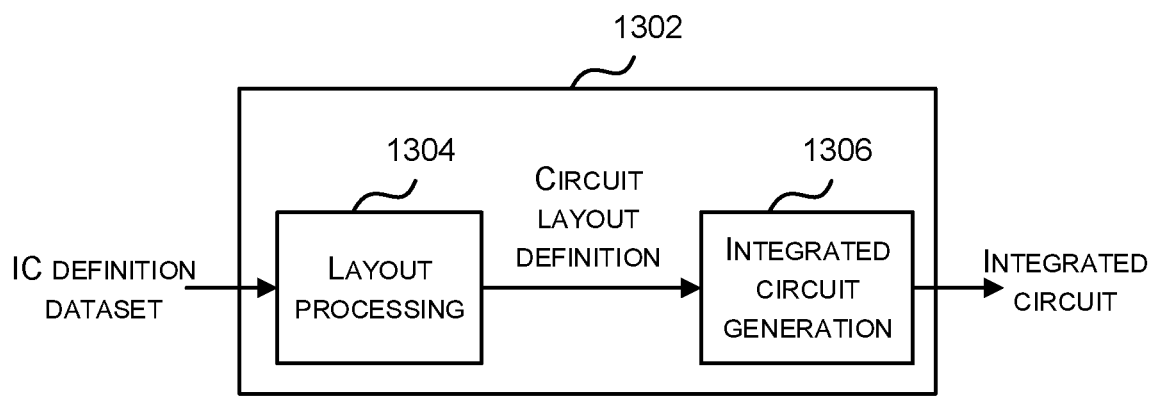
FIG. 13 shows an integrated circuit manufacturing system for generating an integrated circuit embodying a graphics processing system.

FIG. 13 shows an example of an integrated circuit (IC) manufacturing system 1002 which is configured to manufacture a data compression or decompression apparatus as described in any of the examples herein. In particular, the IC manufacturing system 1302 comprises a layout processing system 1304 and an integrated circuit generation system 1306. The IC manufacturing system 1302 is configured to receive an IC definition dataset (e.g. defining a data compression or decompression apparatus as described in any of the examples herein), process the IC definition dataset, and generate an IC according to the IC definition dataset (e.g. which embodies a data compression or decompression apparatus as described in any of the examples herein). The processing of the IC definition dataset configures the IC manufacturing system 1302 to manufacture an integrated circuit embodying a data compression or decompression apparatus as described in any of the examples herein.

The layout processing system 1304 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1304 has determined the circuit layout it may output a circuit layout definition to the IC generation system 1306. A circuit layout definition may be, for example, a circuit layout description.

The IC generation system 1306 generates an IC according to the circuit layout definition, as is known in the art. For example, the IC generation system 1306 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1306 may be in the form of computer-readable code which the IC generation system 1306 can use to form a suitable mask for use in generating an IC.

The different processes performed by the IC manufacturing system 1302 may be implemented all in one location, e.g. by one party. Alternatively, the IC manufacturing system 1302 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a data compression or decompression apparatus without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 13 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 13, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

A first aspect provides a method of data compression comprising: receiving a plurality of data items; encoding groups of data items by generating, for each of the groups, header data comprising h-bits and a plurality of body portions each comprising b-bits and each of the body portions corresponding to a data item in the group, wherein b is fixed within a group and wherein the header data for a group comprises an indication of b for the body portions of that group; generating, for each of the groups where b>0, a body data field for the group by interleaving bits from the body portions corresponding to data items in the group; and storing one or more encoded data blocks comprising the header data and the body data fields.

In some examples, h is fixed for all groups and b is not fixed between groups.

b may be an integer greater than or equal to zero and h is an integer greater than zero.

Said storing one or more encoded data blocks may comprise: storing a body data block comprising body data fields for a plurality of groups; and storing a header data block comprising header data for the plurality of groups.

Said interleaving bits from the body portions corresponding to data items in the group may comprise: (a) inserting a first bit from each of the body portions into the body data field; (b) inserting a next bit from each of the body portions into the body data field; and (c) repeating (b) until all bits from each of the body portions have been inserted into the body data field.

Said inserting a first bit from each of the body portions into the body data field may comprise inserting a least significant bit from each of the body portions into the body data field and wherein inserting a next bit from each of the body portions into the body data field may comprise inserting a next least significant bit from each of the body portions into the body data field.

Said encoding groups of data items may comprise, for each of the groups: receiving the group of data items; identifying a body portion size, b, by locating a bit position of a most significant leading one across all the data items in the group; generating the header data comprising a bit sequence encoding the body portion size; and generating a body portion comprising b-bits for each of the data items in the group by removing none, one or more leading zeros from each data item.

Said identifying a body portion size may further comprise: checking if the identified body portion size is a valid body portion size; and in response to determining that the identified body portion size is not a valid body portion size, updating the body portion size to a next largest valid body portion size.

The method may further comprise, prior to encoding groups of data items: analysing a plurality of groups of data items to generate a set of valid body portion sizes.

Said analysing a plurality of groups of data items to generate a set of valid body portion sizes may comprise: analysing the data items in the plurality of groups of data items to identify a body portion size for each of the plurality of groups; identifying one or more least common body portion sizes for the plurality of groups of data items; and generating the set of valid body portion sizes by removing from a set of all possible body portion sizes, those body portion sizes corresponding to the identified one or more least common body portion sizes.

The set of valid body portion sizes may comprise $2^h$ different valid body portion sizes.

The data items may comprise weights for a neural network.

Said analysing a plurality of groups of data items to generate a set of valid body portion sizes may comprise, for each layer in the neural network: analysing all weights for the layer to generate a set of valid body portion sizes for that layer.

The data items may have a distribution centred substantially on zero and the method may further comprise, prior to encoding a group of data items, pre-processing the data items in the group by converting all data items having a negative value to positive values and interleaving the converted data items with data items having a positive value.

The data items may have a distribution centred on a non-zero value and the method may further comprise, prior to encoding a group of data items, pre-processing the data items in the group by shifting all data items such that the shifted distribution is centred substantially on zero and then converting all shifted data items having a negative value to positive values and interleaving the converted shifted data items with shifted data items having a positive value.

A second aspect provides a method of data decompression comprising: receiving one or more blocks of data, the one or more blocks of data encoding one or more groups of data items; reading header data into a first buffer; reading body data into a second buffer; and for each of the encoded groups of data items: reading header data for the group from the first buffer, wherein the header data for a group of data items comprises a h-bit indication of a body portion size, b, for the group of data items, wherein b is fixed within a group; determining the body portion size, b, for the group of data items from the header data; reading a body data field from the second buffer based on the determined body portion size, the body data field comprising interleaved body portions, with one body portion for each of the data items in the group; decoding the body data field to generate the decoded data items, the decoding comprising de-interleaving the body portions, wherein each of the decoded data items comprises n bits, where n≥b; and outputting the decoded data items.

In some examples, h is fixed for all groups and b is not fixed between groups.

b may be an integer greater than or equal to zero and h may be an integer greater than zero.

The body data field may comprise a plurality of concatenated sections, each of the sections comprising one bit from each body portion, and wherein decoding the body data field may comprise: starting with an initial set of data items comprising only zeros, one for each data item in the group, reading sections of the body data field and for each section of the body data field, overwriting one of the zeros for each of the data items with a bit value from the section of the body data field to generate the decoded data items; or generating a body data mask comprising ones in bit positions corresponding to the determined body portion size, reading sections of the body data field and for each section of the body data field, combining one of the bits in the body data mask for each of the data items with a bit value from the section of body data field.

The first section in the body data field may comprise a least significant bit from each of the body portions, the subsequent section may comprise a next least significant bit from each of the body portions and a last section in the body data field may comprise a most significant bit from each of the body portions.

The method may further comprise, prior to outputting the decoded data items, post-processing the decoded data items in the group to convert one or more of the data items from positive values to negative values.

The post-processing may further comprise applying an offset to each of the data items.

The data items may comprise weights for a neural network.

A third aspect provides a data compression apparatus comprising: an input for receiving a plurality of data items; an encoding module configured to encode groups of data items by generating, for each of the groups, header data comprising h-bits and a plurality of body portions each comprising b-bits and each of the body portions corresponding to a data item in the group, wherein b is fixed within a group and wherein the header data for a group comprises an indication of b for the body portions of that group; an interleaving module configured to generate a body data field for each of the groups by interleaving bits from the body portions corresponding to data items in the group; and a memory interface configured to output, for storage, one or more encoded data blocks comprising the header data and the body data field.

A fourth aspect provides a data decompression apparatus comprising: one or more inputs for receiving one or more blocks of data, the one or more blocks of data encoding one or more groups of data items; a header read module configured to read header data into a first buffer; a body read module configured to read body data into a second buffer; and a decoding module configured, for each of the encoded groups of data items, to: read header data for the group from the first buffer, wherein the header data for a group of data items comprises a h-bit indication of a body portion size, b, for the group of data items, wherein b is fixed within a group; determine the body portion size, b, for the group of data items from the header data; read a body data field from the second buffer based on the determined body portion size, the body data field comprising interleaved body portions, with one body portion for each of the data items in the group; decode the body data field, comprising de-interleaving the body portions (704), to generate the decoded data items, wherein each of the decoded data items comprises n bits, where n≥b; and output the decoded data items.

A fifth aspect provides a compression apparatus comprising: an input configured to receive weights to be used in a neural network; a compression module configured to compress the weights; and a memory interface configured to output the compressed weights for storage.

A sixth aspect provides a hardware implementation of a neural network, the hardware implementation comprising decompression apparatus comprising: an input configured to receive compressed weights to be used in the neural network; and a decompression module configured to decompress the compressed weights; wherein the hardware implementation is configured to use the decompressed weights in the neural network.

A seventh aspect provides a method of compressing weights to be used in a neural network.

An eighth aspect provides a method of decompressing weights to be used in a neural network.

A ninth aspect provides computer readable code configured to cause any of the methods described herein to be performed when the code is run.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget."

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A method of data compression, comprising:
   receiving a plurality of data items;
   encoding groups of data items by generating, for each of the groups, header data comprising h bits and a plurality of body portions, each body portion comprising b bits and each of the body portions corresponding to a data item in the group, wherein b is fixed within a group and wherein the header data for a group comprises an indication of b for the body portions of that group;
   generating, for each of the groups where b>0, a body data field for the group by interleaving bits from the body portions corresponding to data items in the group; and
   storing one or more encoded data blocks comprising the header data and the body data fields.

2. The method according to claim 1, wherein h is fixed for all groups and b is not fixed between groups.

3. The method according to claim 1, wherein storing one or more encoded data blocks comprises:
   storing a body data block comprising body data fields for a plurality of groups; and
   storing a header data block comprising header data for the plurality of groups.

4. The method according to claim 1, wherein interleaving bits from the body portions corresponding to data items in the group comprises:
   (a) inserting a first bit from each of the body portions into the body data field;
   (b) inserting a next bit from each of the body portions into the body data field; and
   (c) repeating (b) until all bits from each of the body portions have been inserted into the body data field.

5. The method according to claim 4, wherein inserting a first bit from each of the body portions into the body data field comprises inserting a least significant bit from each of the body portions into the body data field and wherein inserting a next bit from each of the body portions into the body data field comprises inserting a next least significant bit from each of the body portions into the body data field.

6. The method according to claim 1, wherein encoding groups of data items comprises, for each of the groups:
   receiving the group of data items;
   identifying a body portion size, b, by locating a bit position of a most significant leading one across all the data items in the group;
   generating the header data comprising a bit sequence encoding the body portion size; and
   generating a body portion comprising b-bits for each of the data items in the group by removing none, one or more leading zeros from each data item.

7. The method according to claim 6, wherein identifying a body portion size further comprises:
   checking if the identified body portion size is a valid body portion size; and
   in response to determining that the identified body portion size is not a valid body portion size, updating the body portion size to a next largest valid body portion size.

8. The method according to claim 7, further comprising, prior to encoding groups of data items:
   analysing a plurality of groups of data items to generate a set of valid body portion sizes.

9. The method according to claim 8, wherein analysing a plurality of groups of data items to generate a set of valid body portion sizes comprises:
   analysing the data items in the plurality of groups of data items to identify a body portion size for each of the plurality of groups;
   identifying one or more least common body portion sizes for the plurality of groups of data items; and
   generating the set of valid body portion sizes by removing from a set of all possible body portion sizes, those body portion sizes corresponding to the identified one or more least common body portion sizes.

10. The method according to claim 1, wherein the data items comprise weights for a neural network.

11. The method according to claim 10, wherein analysing a plurality of groups of data items to generate a set of valid body portion sizes comprises, for each layer in the neural network:
analysing all weights for the layer to generate a set of valid body portion sizes for that layer.

12. The method according to claim 1,
wherein the data items have a distribution centred substantially on zero and the method further comprises, prior to encoding a group of data items, pre-processing the data items in the group by converting all data items having a negative value to positive values and interleaving the converted data items with data items having a positive value, or
wherein the data items have a distribution centred on a non-zero value and the method further comprises, prior to encoding a group of data items, pre-processing the data items in the group by shifting all data items such that the shifted distribution is centred substantially on zero and then converting all shifted data items having a negative value to positive values and interleaving the converted shifted data items with shifted data items having a positive value.

13. A method of data decompression, comprising:
receiving one or more blocks of data, the one or more blocks of data encoding one or more groups of data items;
reading header data into a first buffer;
reading body data into a second buffer; and
for each of the encoded groups of data items:
reading header data for the group from the first buffer, wherein the header data for a group of data items comprises a h-bit indication of a b-bit body portion size for the group of data items, wherein b is fixed within a group;
determining the bit size b of the body portion for the group of data items from the header data;
reading a body data field from the second buffer based on the determined body portion size, the body data field comprising interleaved body portions, with one body portion for each of the data items in the group;
decoding the body data field to generate the decoded data items, the decoding comprising de-interleaving the body portions, wherein each of the decoded data items comprises n bits, where n≥b; and
outputting the decoded data items.

14. The method according to claim 13, wherein h is fixed for all groups and b is not fixed between groups.

15. The method according to claim 13, wherein the body data field comprises a plurality of concatenated sections, each of the sections comprising one bit from each body portion, and wherein decoding the body data field comprises:
starting with an initial set of data items comprising only zeros, one for each data item in the group, reading sections of the body data field and for each section of the body data field, overwriting one of the zeros for each of the data items with a bit value from the section of the body data field to generate the decoded data items; or
generating a body data mask comprising ones in bit positions corresponding to the determined body portion size, reading sections of the body data field and for each section of the body data field, combining one of the bits in the body data mask for each of the data items with a bit value from the section of body data field.

16. The method according to claim 15, wherein the first section in the body data field comprises a least significant bit from each of the body portions, the subsequent section comprises a next least significant bit from each of the body portions and a last section in the body data field comprises a most significant bit from each of the body portions.

17. The method according to claim 13, wherein the data items comprise weights for a neural network.

18. A data compression apparatus, comprising:
an input for receiving a plurality of data items;
an encoding module configured to encode groups of data items by generating, for each of the groups, header data comprising h bits and a plurality of body portions, each body portion comprising b bits and each of the body portions corresponding to a data item in the group, wherein b is fixed within a group and wherein the header data for a group comprises an indication of b for the body portions of that group;
an interleaving module configured to generate a body data field for each of the groups by interleaving bits from the body portions corresponding to data items in the group; and
a memory interface configured to output, for storage, one or more encoded data blocks comprising the header data and the body data field.

19. A non-transitory computer readable storage medium having stored thereon computer readable instructions that, when executed at a computer system, cause the computer system to perform the method of claim 1.

20. A non-transitory computer readable storage medium having stored thereon computer readable instructions that, when executed at a computer system, cause the computer system to perform the method of claim 13.

* * * * *